April 23, 1968 C. E. HOGUE 3,380,002
SURE-STARTING ASTABLE MULTIVIBRATOR CIRCUIT
Filed Sept. 7, 1965
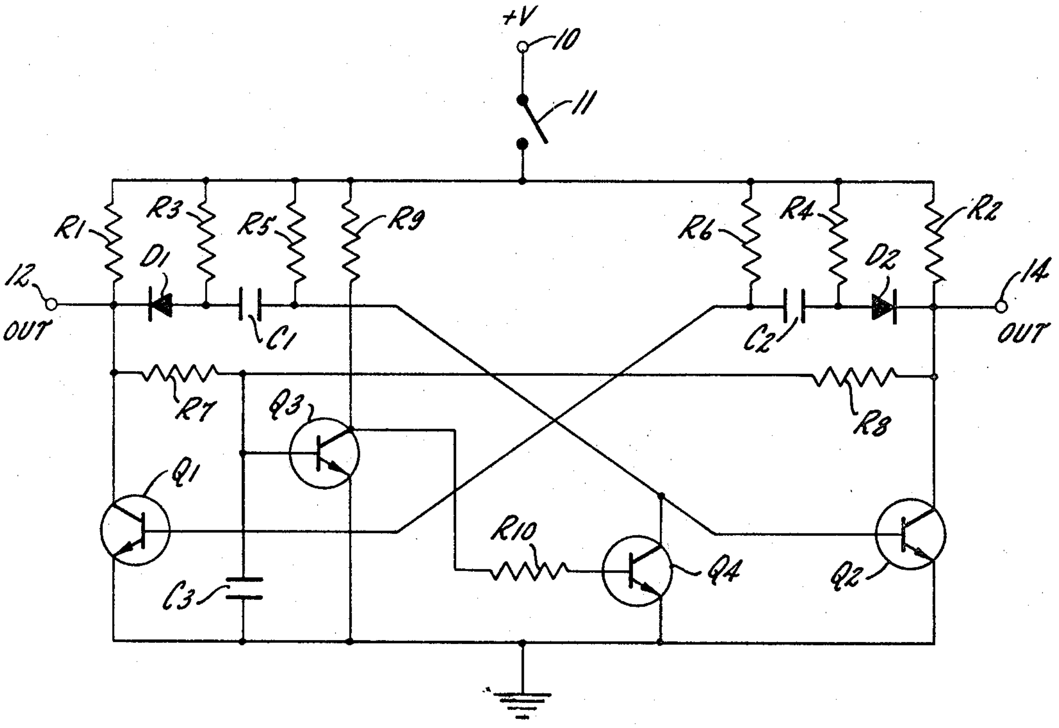
INVENTOR.
Clifford E. Hogue,
BY
H. H. Losche
ATT'YS.

3,380,002

SURE-STARTING ASTABLE MULTIVIBRATOR CIRCUIT

Clifford E. Hogue, Indianapolis, Ind., assignor to the United States of America as represented by the Secretary of the Navy

Filed Sept. 7, 1965, Ser. No. 485,651
7 Claims. (Cl. 331—113)

ABSTRACT OF THE DISCLOSURE

A solid state astable multivibrator circuit having a novel semiconductor network adapted to immediately decrease the bias voltage presented to the control electrode of one of the two alternately conducting multivibrator transistors at the time the multivibrator is ini ially switched on. This initial control of the bias voltage of one of the two multivibrator transistors prevents it from attempting to commence conduction simultaneously with the other multivibrator transistor, thereby allowing the other to always conduct first thus insuring rapid, sure starting of the multivibrator oscillations.

The invention described herein may be manufactured and used by or for the Government of the United States of America for governmental purposes without the payment of any royalties thereon or therefor.

*Background of the invention*

This invention relates to semiconductor multivibrator circuits in general and more particularly to a semiconductor astable multivibrator with a semiconductor network to insure that both semiconductors of the multivibrator do not start conduction simultaneously to provide a sure-start multivibrator circuit.

Astable multivibrators, or free-running multivibrators, employing solid state devices or semiconductors are well known, but difficulty has been experienced in both semiconductors going into conduction initially whenever the power supply is turned "on." If the loop gain is high enough, any small disturbance or inequality in the circuit elements will cause one semiconductor to remain in conduction which will cut the other semiconductor off for the first half oscillation to start it in its free-running condition; however, it provides a slow start which is objectionable for many applications such as the timing circuits of a radar, or the like. Any means to start the multivibrator in its free-running oscillations rapidly would enhance more accurate timing and precision for radar circuitry.

*Summary of the invention*

In the present invention a conventional semiconductor astable multivibrator circuit is modified with a semiconductor network in a manner to cause a predetermined one of the two multivibrator semiconductors to initially conduct first in starting the free-running oscillations. This is accomplished by adding two semiconductors in a network to immediately reduce the base bias on the other multivibrator semiconductor so that the one multivibrator semiconductor will initiate the oscillations for every start.

In this manner a sure-start of oscillations is immediately generated without any loss of time in natural selection of conduction between the multivibrator semiconductors and it does not rely on a loop gain or random disturbance to start. It is therefore a general object of this invention to provide a solid state semiconductor multivibrator circuit with a semiconductor network to insure a start of multivibrator voltage oscillations initially with each turn-on of the multivibrator circuit.

*Brief description of the drawings*

These and other objects and the attendant advantages, features, and uses will become more apparent to those skilled in the art as the description proceeds when considered along with the accompanying drawing showing a circuit schematic of the invention.

*Description of the preferred embodiment*

Referring more particularly to the figure of drawing, transistors Q1 and Q2 are in circuit with a voltage source having one terminal at 10 and the opposite terminal at ground. The positive terminal of the voltage source 10 is coupled through a switch 11 to the collector of the transistor Q1 through the collector load resistor R1, and to the collector of transistor Q2 through the collector load resistor R2. The emitters of transistors Q1 and Q2 are coupled in common to the opposite terminal, or ground, of the voltage source 10. The base electrode of transistor Q1 is coupled through a capacitor C2 and a diode D2 in series to the collector of transistor Q2 while the base of transistor Q2 is coupled through a capacitor C1 and a diode D1 in series to the collector of transistor Q1. The diodes D1 and D2 each have their cathode connected to the collector electrode of the transistors Q1 and Q2, respectively. The junction of the diode D1 and capacitor C1 is biased through a resistor R3 from the voltage source 10 while the junction of diode D2 and capacitor C2 is biased through a resistor R4. The base of transistor Q2 is biased from the voltage source through a resistor R5 and the base of transistor Q1 is biased through a resistor R6. The above described circuitry provides an astable multivibrator which will produce alternate voltage oscillations on the collector outputs 12 and 14 of transistors Q1 and Q2. It is known in such circuitry of astable multivibrators that when the supply current is switched "on," such as by switch 11, both transistors Q1 and Q2 will attempt to go to saturation. If the loop gain is high enough, any small disturbances in the circuit or any inequalities in circuit elements would cause one of the transistors Q1 or Q2 to predominate to produce the first half cycle of the free-running oscillations of operation. This attempt of both transistors Q1 and Q2 to initially conduct when the switch 11 is thrown to its contact position to start the free-running oscillator is quite a disadvantage for accurate timing circuits. For the purpose of example herein transistors Q1 and Q2 are shown as NPN elements although PNP transistors could be used with a reversal of polarity.

To overcome the normal disadvantage of astable free-running multivibrators by enabling them to make a sure, quick start, two additional transistor Q3 and Q4 are included in the network of the astable multivibrator to insure starting of only one of the multivibrator transistors Q1 or Q2 with each application of supply current through the switch 11. This network consists of coupling the collector electrodes of transistors Q1 and Q2 through resistors R7 and R8 in series. The transistor Q3 has its base electrode coupled to the junction of resistors R7 and R8 and also coupled to one plate of a charging capacitor C3, the opposite plate of which is coupled to the common emitter coupling of transistors Q1 and Q2 for ground potential. A collector load is supplied to transistor Q3 from the voltage source 10 through a resistor R9 and the emitter of the transistor is coupled directly to ground. The fourth transistor Q4 has its base coupled through a resistor R10 to the collector electrode of transistor Q3 and its collector and emitter coupled in parallel with the base and emitter of transistor Q2. Transistors Q3 and Q4 are shown also as of the NPN type for an illustrative example herein although PNP transistors are equally applicable with polarity changes.

While the invention may be readily carried out with elements of the practitioners' own choice, one example of a practical operative device may be accomplished with the following values given to the several elements.

| | | |
|---|---|---|
| Resistors: | | |
| R1, R2, R3, and R4 | ohms | 750 |
| R5 and R6 | do | 1.73K |
| R7 and R8 | do | 2.7K |
| R9 | do | 2K |
| R10 | do | 7.5K |
| Capacitors: | | |
| C1 and C2 | picofarads (pf.) | 650 |
| C3 | do | 470 |
| Terminal 10 | volts | 12 |

*Operation*

In the operation of the device shown in the figure of drawing, let it be assumed that switch 11 is switched closed. Since R5 and R6 are equal, the base biases for transistors Q1 and Q2 will be equal and each transistor will attempt to conduct. This attempt of both transistors Q1 and Q2 to conduct will readily drop the voltage on the base of transistor Q3 through the resistors R7 and R8 placing transistor Q3 in a cut-off condition thereby providing a high collector voltage which is conducted by way of resistor R10 to the base of transistor Q4. The high base voltage on transistor Q4 immediately places this transistor in conduction to establish an equal base and emitter voltage on transistor Q2 placing this transistor in a quiescent or cutoff state. Transistor Q1 continues to conduct in the first half cycle of oscillation reducing the collector voltage on the output 12 which is reflected back through the diode D1 and capacitor C1 to the base of transistor Q2 sharpening the rise in the voltage pulse on the output 14 from the collector of transistor Q2. The positive voltage pulse on the collector of transistor Q3 is decoupled from the base of transistor Q1 by the diode D2. The rise in the collector voltage of transistor Q2 operating through the resistor R8 charges capacitor C3 raising the base voltage to place Q3 into conduction or saturation thereby cutting off transistor Q4. With transistor Q4 cut off, the base voltage of transistor Q2 will rise by virtue of its bias through resistor R5, this direct current voltage being isolated or decoupled from the collector of transistor Q1 by capacitor C1. As the base of transistor Q2 goes above ground voltage, transistor Q2 will begin to conduct producing a negative trailing edge on the output 14 which is coupled through C2 to the base of transistor Q1 immediately cutting off this transistor to sharpen the leading edge of the positive going pulse on the collector. This is a switch in conduction between transistors Q1 and Q2 to produce the first half cycle of the oscillation. With transistor Q1 cut off, its collector voltage on the output 12 will rise rapidly which is operative through the resistor R7 on the base of transistor Q3 to maintain transistor Q3 in a conductive saturation state. Since tratnsistor Q3 is a conductive state, transistor Q4 will remain cut off. The positive going pulse on the collector of transistor Q1 is blocked by the diode D1 from the base of transistor Q2. Since the capacitor C2 decouples the D.C. voltage from the collector of transistor Q2, the base voltage of transistor Q1 will rise through its biasing resistor R6 until Q1 is again placed into conduction completing the first cycle of the oscillation for the astable multivibrator. Resistors R5 and R6 together with the capacitors C1 and C2 time the conduction periods of the transistors Q1 and Q2. This alternate conduction of transistors Q1 and Q2 produces alternate positive and alternate negative going output pulses on the output terminals 12 and 14, as may be readily understood by those skilled in the art. It may be recognized that once transistor Q3 is placed in a conductive state following its sure start operation, it never reverts back to its nonconductive state while switch 11 is closed. The only time that transistors Q3 and Q4 become operative is upon the initial closing of the switch 11 at which time both transistors Q1 and Q2 attempt to conduct, each producing a negative base bias on the transistor Q3 momentarily placing it in a nonconductive state to initially start the free running oscillations by placing transistor Q1 into conduction for the first half cycle of the oscillation. After this initial start, transistor Q3 becomes and remains conductive and transistor Q4 becomes and remains nonconductive for the period of time that switch 11 is closed. In this manner the astable multivibrator immediately starts its oscillations by the conduction of transistor Q1 and the nonconduction of Q2 in the first half cycle of every start.

While many modifications and changes may be made in the constructional details and features of this invention by changing the values given as an example herein, or by reversing the polarity and changing the presently disclosed NPN type transistors to PNP type transistors, or by using vacuum tubes as electrons emission devices, it is to be understood that I desire to be limited in the spirit of my invention only by the scope of the appended claims.

I claim:

1. A sure starting astable multivibrator having first and second electron emission devices each with two conduction and one control electrodes in a free-running multivibrator circuit with one conduction electrode and a control electrode of each interconnected through coupling capacitors and their two conduction electrodes adapted to be switched into a voltage supply circuit, the invention which comprises:
   - a third electron emission device having a control electrode coupled in common through resistors to said one conduction electrode of said first and second electron emission devices and having two conduction electrodes switchably coupled across the respective terminals of said voltage supply circuit; and
   - a fourth electron emission device having two conduction electrodes coupled in parallel to said control electrode and the other conduction electrode of said second electron emission device and having a control electrode coupled to the nongrounded one conduction electrode of said third electron emission device whereby said third and fourth electron emission devices insure that the free-running oscillations on said one conduction electrode of said first and second electron emission devices will initially start with the conduction of the first and the quiescence of the second electron emission devices.

2. A sure starting astable multivibrator circuit comprising:
   - a pair of semiconductors each having base, collector, and emitter electrodes and having the base electrode of each coupled to the collector electrode of the other and the collector and emitter electrodes of each adapted to be coupled across a supply voltage through load resistors;
   - a third semiconductor having a base electrode coupled to the collector electrodes of both of said pair of semiconductors and having emitter and collector electrodes coupled across said voltage supply; and
   - a fourth semiconductor having a base electrode coupled to said collector electrode of said third semiconductor and having emitter and collector electrodes coupled in parallel to the base and emitter electrodes of the other of said pair of semiconductors whereby when the supply voltage is applied, said third and fourth semiconductors coact to initially place said one semiconductor of said pair into conduction and the other of said pair in quiescence for the first half cycle of multivibrator oscillations.

3. A sure starting astable multivibrator as set forth in claim 2 wherein:
   - said coupling of said base electrode of said third semiconductor to said collectors of both of said pair of semiconductors is through a resistance to each with the base electrode of said third semiconductor being coupled to one plate of a charging capacitor, the opposite plate thereof being coupled to a fixed potential terminal of said supply voltage.

4. A sure starting astable multivibrator as set forth in claim 3 wherein:

said coupling of the base electrode of said fourth semiconductor to the collector of said third semiconductor is through a coupling resistor.

5. A sure starting astable multivibrator as set forth in claim 4 wherein:

said first through fourth semiconductors are NPN transistors.

6. A sure starting astable multivibrator circuit comprising:

first and second transistors having their emitters and collectors coupled in parallel across a switched voltage supply through collector load resistors, and having the base of each transistor coupled to the collector of the other transistor through a coupling diode and a coupling capacitor in series, the junction of each series diode and capacitor being biased from said switched voltage supply and each base electrode being biased from said switched voltage supply;

a coupling through two resistors in series between the collectors of said first and second transistors;

a third transistor having a collector coupled through a load resistor to said switched voltage supply, an emitter coupled in common to the emitters of said first and second transistors, and a base electrode coupled to the junction of said two resistors in series; and a fourth transistor having its collector and emitter coupled in parallel to the base and emitter of said second transistor and its base resistor coupled to the collector of said third transistor whereby upon the switched application of supply voltage, said third transistor will be initially cut off to produce conduction of said fourth transistor thereby rendering said second transistor nonconductive and said first transistor conductive in the initial start of oscillations of said first and second transistors, said oscillations being taken as first and second transistor collector outputs.

7. A sure start astable multivibrator as set forth in claim 6 wherein:

said first, second, third, and fourth transistors are of the NPN type and said diodes are each cathode coupled to the collector of the respective first and second transistors.

References Cited

UNITED STATES PATENTS 3,204,200 8/1965 White ------------ 331—113 X

ROY LAKE, *Primary Examiner.*

J. B. MULLINS, *Assistant Examiner.*